(12) United States Patent
Wang et al.

(10) Patent No.: US 11,114,394 B2
(45) Date of Patent: Sep. 7, 2021

(54) SIGNAL ROUTING CARRIER

(71) Applicant: Intel Corporation, Santa Clara, CA (US)

(72) Inventors: Lijiang Wang, Chandler, AZ (US);
Jianyong Xie, Chandler, AZ (US);
Sujit Sharan, Chandler, AZ (US);
Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/536,997

(22) Filed: Aug. 9, 2019

(65) Prior Publication Data
US 2021/0043588 A1 Feb. 11, 2021

(51) Int. Cl.
| | |
|---|---|
| *H01L 23/66* | (2006.01) |
| *H01L 23/15* | (2006.01) |
| *H01L 23/498* | (2006.01) |
| *H01L 23/00* | (2006.01) |
| *H01L 21/48* | (2006.01) |
| *H01P 3/08* | (2006.01) |
| *H01P 11/00* | (2006.01) |
| *H01L 23/14* | (2006.01) |

(52) U.S. Cl.
CPC .......... *H01L 23/66* (2013.01); *H01L 21/4853* (2013.01); *H01L 21/4857* (2013.01); *H01L 23/145* (2013.01); *H01L 23/15* (2013.01); *H01L 23/49822* (2013.01); *H01L 23/49838* (2013.01); *H01L 24/16* (2013.01); *H01P 3/088* (2013.01); *H01P 11/003* (2013.01); *H01L 2223/6616* (2013.01); *H01L 2223/6627* (2013.01); *H01L 2223/6638* (2013.01); *H01L 2224/16227* (2013.01); *H01L 2924/19031* (2013.01)

(58) Field of Classification Search
CPC ................... H01L 24/72; H01L 25/071; H01L 2924/10254; H01L 2924/10272; H01L 2924/1033; H01L 2924/1203; H01L 2924/13055
See application file for complete search history.

(56) References Cited

U.S. PATENT DOCUMENTS

| | | | | |
|---|---|---|---|---|
| 10,403,599 | B2 * | 9/2019 | Delacruz | H05K 1/0243 |
| 2018/0047663 | A1 * | 2/2018 | Camarota | H01L 25/18 |
| 2018/0122773 | A1 * | 5/2018 | Nagai | H01L 25/0657 |
| 2019/0341342 | A1 * | 11/2019 | Raorane | H01L 21/486 |
| 2020/0075521 | A1 * | 3/2020 | Elsherbini | H01L 21/56 |

\* cited by examiner

*Primary Examiner* — Zandra V Smith
*Assistant Examiner* — Andre C Stevenson
(74) *Attorney, Agent, or Firm* — Schwegman Lundberg & Woessner, P.A.

(57) ABSTRACT

An electronic device and associated methods are disclosed. In one example, the electronic device includes an article having a substrate, a semiconductor die thereon, a routing carrier attached to the substrate, and a transmission pathway electrically connected to the semiconductor die and the substrate, wherein the transmission pathway runs through the routing carrier. In selected examples, the article is made by manufacturing a substrate, attaching a semiconductor die to the substrate, fabricating a routing carrier comprising a transmission pathway, and integrating the routing carrier into the substrate.

10 Claims, 7 Drawing Sheets

SIGNAL ROUTING CARRIER

TECHNICAL FIELD

Embodiments described herein generally relate to semiconductor device packaging.

BACKGROUND

As the use of higher speed interfaces, such as serializer-deserializer (SerDes) packages, increases in semiconductor devices, the amount of semiconductor packaging insertion loss should be minimized. In general, the time unit interval (UI) per transferred signal reduce dramatically with high speeds, particularly where circuit timing margins are reduced and long channels are used. Preferably, semiconductor packaging has reduced transmission line loss and maintains low manufacturing risks and substrate yields.

It is desired to have semiconductor packaging architecture that address these concerns, and other technical challenges.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The semiconductor package architecture and methods described herein can, in some embodiments, reduce package insertion loss. Insertion loss is the loss of signal power resulting from the insertion of a device in a transmission line and can in the context of semiconductor packaging be referred to as "transmission line loss." Insertion loss (IL) is expressed in decibels (dB) given by the following formula:

$$IL = 10 \log_{10} \frac{P_T}{P_R}$$

Where the power transmitted to the load before insertion is $P_T$ and the power received by the load after insertion is $P_R$.

The architecture discussed herein uses a high-speed signal routing carrier to reduce insertion loss (e.g., transmission line loss) by re-routing the transmission line(s) in a semiconductor package from a semiconductor die, through a cored substrate, and to electrical bumps or another outlet. Example schemes that can be used to reduce package insertion loss include a high-speed signal routing carrier located on the surface of the package's cored substrate, or a high-speed signal routing carrier embedded in the cored substrate.

The semiconductor package architecture described herein can, in some embodiments, can have large trace widths and varying dielectric thicknesses, reducing overall signal loss.

For example, a high-speed interface such as a serializer deserializer (SerDes) transmits and receives signal via a transmission line. The transmission line connection can run from input/output (IO) on a SerDes physical layer (PHY) to a ball grid array (BGA) ball on the periphery of the semiconductor package. The PHY can be within the footprint of the die. In a conventional SerDes package, this transmission line can have a long routing length, such as, for example, greater than 20 mm. This is due in part to the transmission line running through layers of a cored substrate in the package. This is particularly true for server applications.

Such a SerDes set-up generally includes dielectric layers interspersed with conductive layers in the cored substrate. The dielectric layers can have, for example, a thickness of up to about 25 or 30 μm. For a given dielectric layer thickness, the trace width (TW) must be narrow to meet the differential line characteristic impedance (e.g., 85 to 90 Ohm). This can result in larger transmission line loss as the transmission line runs through the cored substrate, particularly where the signaling speed reaches greater than 112 Gbps (e.g., 224 Gbps). This can result in overall package insertion loss.

In contrast, the semiconductor package architecture described herein can benefit semiconductor packaging with high-speed IO or similar packaging schemes requiring package insertion loss (e.g., transmission loss) reduction. This can, for example, allow for routing of HS IO communications with short reach (e.g., about 2 mm to about 5 mm channels). The architecture can allow for a larger amount of high-speed IO signals to be routed through the semiconductor package without taking up space in regular package layers with large voiding. This can, for example, reduce the package layer count overall.

A high-speed signal routing carrier can be manufactured from a variety of substrates depending on the package specifications. For example, the substrate can be a glass ceramic, an organic substrate, a printed circuit board, or other suitable alternatives. The substrate material can be selected for the routing carrier depending on the manufacturing process of the package as a whole. The routing carrier can be, for example, manufactured during normal package manufacturing. The manufacturing of the package with the routing carrier can be configured depending on electrical and material requirements. Various high-speed interfaces can be used for the routing carrier depending on the package itself.

The use of a routing carrier in a semiconductor package can allow design schemes or configuration that have greater flexibility in routing area and direction, reducing cross-talk between channels compared to conventional packaging. Additionally, this can allow for more are in the package for other input/output (IO) signals to be routed through the cored substrate layers in the package. This can potentially increase package performance and flexibility.

The significant package transmission line loss reduction from the use of a routing carrier allows better platform planning and optimization. For example, more efficient BGA ball mapping or the use of landside cavities for LSC can enable power delivery benefits.

Figure 1A:
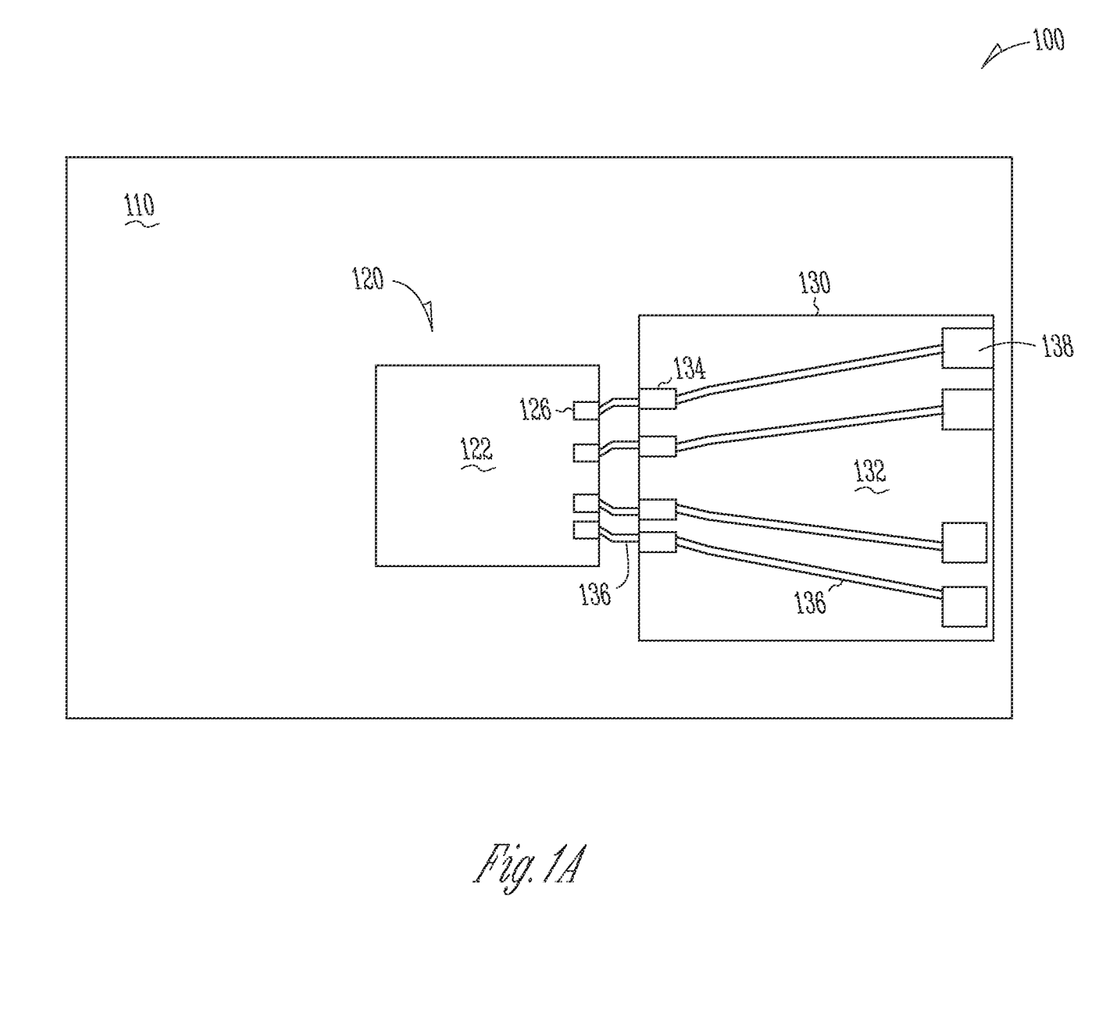
FIG. 1A shows a schematic diagram of a semiconductor package containing a high-speed signal routing carrier on a package surface from a top-down view in accordance with some example embodiments.
Figure 1B:
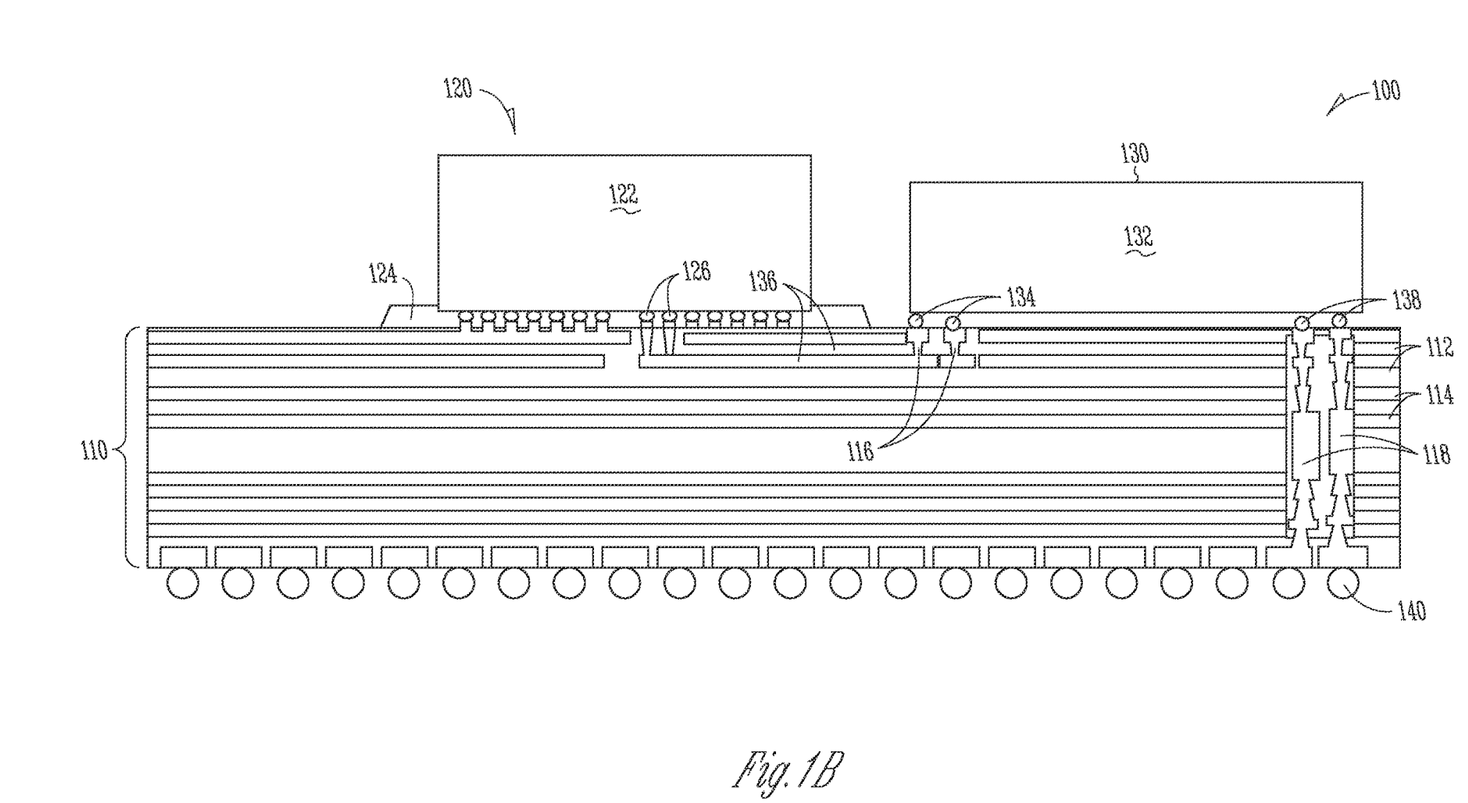
FIG. 1B shows a schematic diagram of a semiconductor package containing a high-speed signal routing carrier on a package surface from a side view in accordance with some example embodiments.

FIGS. 1A and 1B are schematic diagrams of a semiconductor package 100 containing a high-speed signal routing carrier 130 on the package 100 surface. FIG. 1A shows a top-down view, while FIG. 1B shows a side view. FIGS. 1A and 1B will be discussed together.

Package 100 includes cored substrate 110, semiconductor die 120, routing carrier 130, and electrical bumps 140. Cored substrate 110 includes dielectric layers 112 and conductive layers 114, in addition to via 116, 118. Semiconductor die 120 includes active IC chip 122, die underfill 124, and high-speed differential pair pins 126. Routing carrier 130 includes routing substrate 132, entrance differential pair pins 134, differential pair 136, and exit differential pair pins 138.

In package 100, semiconductor die 120 and routing carrier 130 reside on a first surface of cored substrate 110. Electrical bumps 140 reside on a second surface of cored substrate 110, opposite the first surface. Semiconductor die 120 is electrically connected to electrical bumps 140 through routing carrier 130 and cored substrate 110. Specifically, a transmission pathway runs from IC chip 122 through cored substrate 110 and up via 116 to routing carrier 130, down via 118 through cored substrate 110 to package bumps 140.

Cored substrate 110 can be a cored substrate such as, for example, a conventional cored substrate found in a semiconductor package. Cored substrate 110 can include a plurality of layers, such as dielectric layers 112 interspersed with conductive layers 114. Dielectric layers 112 can be, for example, a nonconductive material. Conductive layers 114 can be, for example, metallic or other conductive material. Dielectric layers 112 can electrically isolate conductive layers 114 from each other. Layers 112, 114, can, for example, run parallel to each other to form cored substrate 110. Cored substrate 110 is one example of a suitable substrate for this architecture. In other examples, the substrate may or may not be cored.

Via 116, 118, can run orthogonal to layers 112, 114, and create vertical connections between conductive layers 114. Via 116, 118 can be, for example drilled into package 100 and include metallic or other conductive traces. In package 100, via 116 can electrically connect IC chip 122 on the surface of package 100 into cored substrate 110 and to routing carrier 130. In package 100, via 118 can electrically connect routing carrier 130 through layers 112, 114, to packages bumps 140 on a bottom surface of package 100.

Semiconductor die 120 resides on the top surface of package 100, opposite package bumps 140. Semiconductor die 120 can contain, for example, an IC chip 122 attached to the package 100 by a die underfill 124. IC chip 122 can host a pair of pins 126 to which a differential pair can be electrically connected.

Routing carrier 130 allows for routing of a transmission pathway, including, for example, a differential pair, from semiconductor die 120 to package bumps 140 without running the differential pair through all of cored substrate 110. Routing carrier 130 can be mounted to the surface of package 100 adjacent semiconductor die 120.

Routing carrier 130 can be made of substrate 132, which can be, for example, a glass ceramic, organic, or other printed circuit board material, depending on package 100 requirements and materials. The thickness and shape of routing carrier 130 can be tailored based on the amount of dielectric and conductive layers in the cored substrate 110 and based on the desired material loss characteristics. The substrate 132 can have, for example, a different dielectric constant than surrounding materials.

Routing carrier 130 can, for example, contain multiple conductive (e.g., metallic) layers and multiple nonconductive (e.g., dielectric) layers, as shown and discussed with reference to FIGS. 3 and 4A-4B. Various design schemes for differential pair 136 can be used inside the routing carrier 130.

High speed differential pair 136 can be a transmission line or routing through routing carrier 130 inlaid with a metallic (or other conductive) trace. The trace can be, for example, copper, having a thickness of about 20 to about 35 µm.

In package 100, high speed differential pair 136 can exit IC chip 122 at differential pair pins 126. High speed signal differential pair 136 can break out into a conductive layer 114 in cored substrate 110 with a short routing length, and via up (through via 116) to the package 100 surface to enter the routing carrier 130 at differential pair pins 134. Differential pair 136 exits the routing carrier 130 at pins 138 and runs through via 118 down to package bumps 140.

Figure 2:
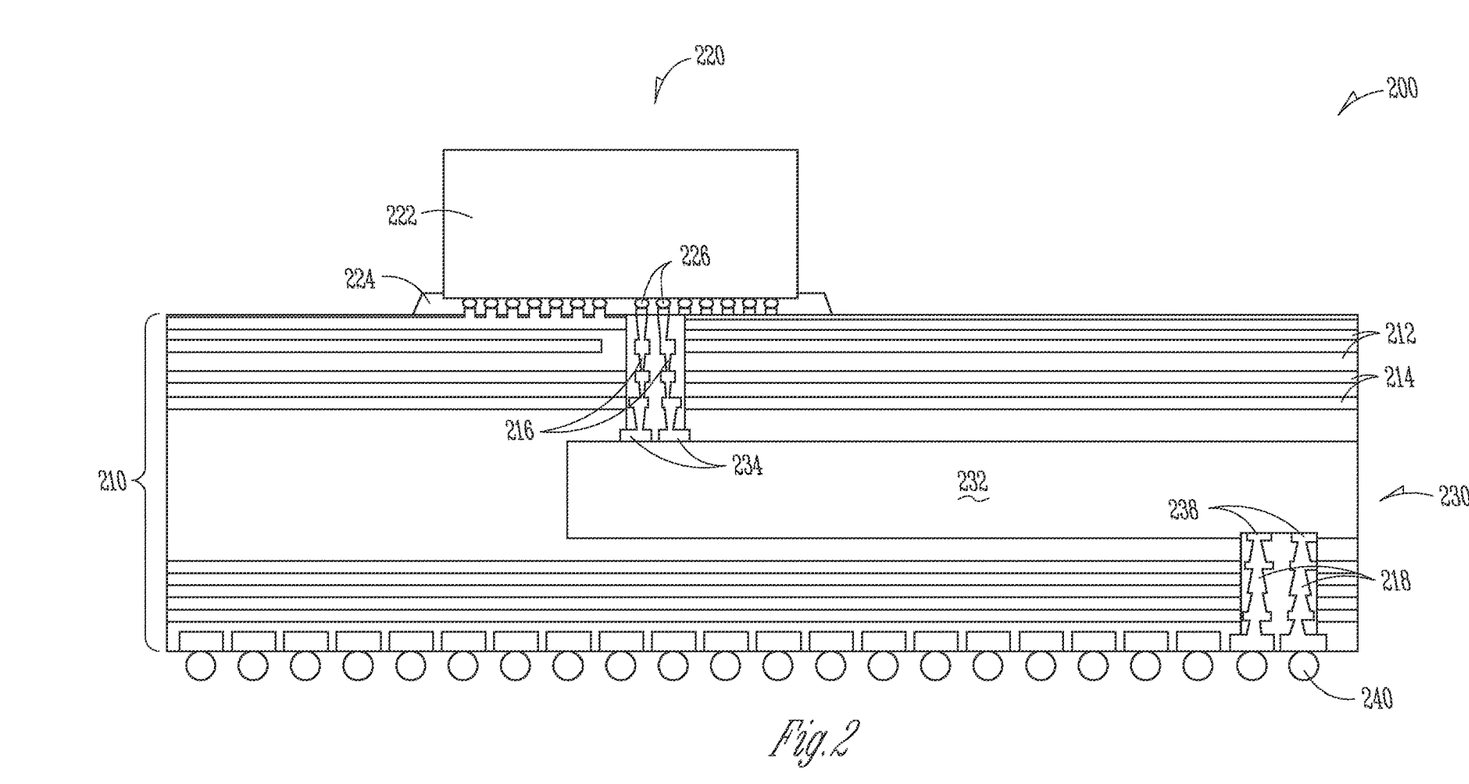
FIG. 2 shows a schematic diagram of a semiconductor package containing a high-speed signal routing carrier embedded in a package core layer from a sideview in accordance with some example embodiments.

FIG. 2 shows a schematic diagram of a semiconductor package 200 containing a high-speed signal routing carrier embedded in a package core layer from a side view. The components of FIG. 2 are similar to those in FIGS. 1A-1B. Package 200 includes cored substrate 210 with dielectric layers 212, conductive layers 214, and via 216, 218, semiconductor die 220 with IC chip 222, die underfill 224, and high speed differential pair pins 226, routing carrier 230 with substrate 232, entrance pins 234, differential pair 236, and exit pins 238, and package bumps 240. The components of package 200 are connected in a similar fashion to those discussed with reference to FIGS. 1A-1B.

However, routing carrier 230 is embedded within cored substrate 210 of package 200. Routing carrier 230 can be embedded within layers 212, 214. Here, differential pair 236 can run from IC chip 222 through via 216 to routing carrier 230, exit to via 218 and run down to package bumps 240.

Figure 3:
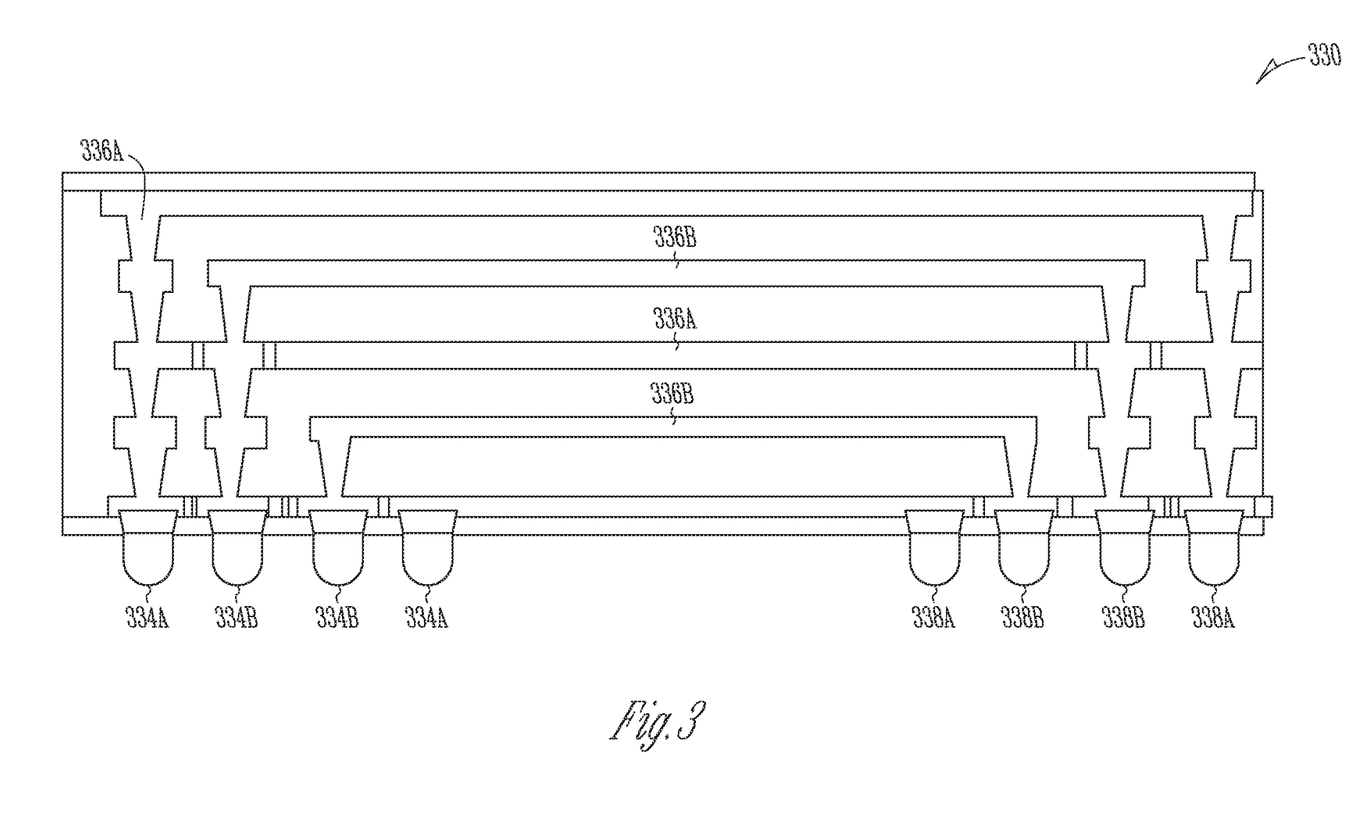
FIG. 3 shows a schematic diagram of a side view of a high-speed signal routing carrier in accordance with some example embodiments.

FIG. 3 shows a schematic diagram of a side view of a high-speed signal routing carrier 330. Carrier 330 is an embodiment of carrier 130 or 230 shown in FIGS. 1A, 1B and 2. Carrier 330 can be made of substrate 332. Substrate 332 can be, for example, a glass ceramic, organic, or other printed circuit board material.

Carrier 330 can include differential pair routing 336a, 336b running through substrate 332. Routing 336a and routing 336b are opposing halves of differential pair 336. Routing 336a and 336b can run from entrance pins 334a, 334b, through substrate 332, and out exit pins 338a, 338b.

Figure 4A:
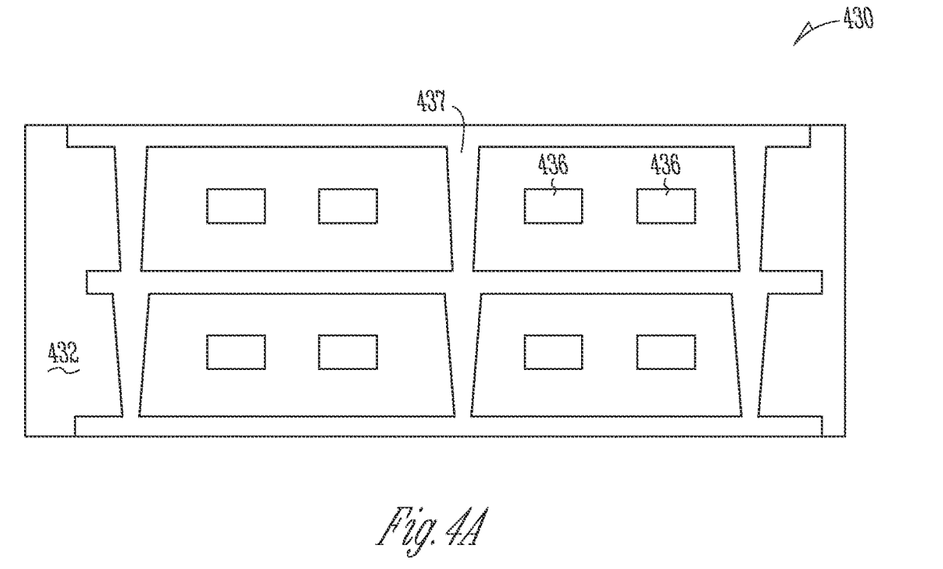
FIG. 4A shows a schematic diagram of a cross-sectional view of a high-speed signal routing carrier in accordance with some example embodiments.
Figure 4B:
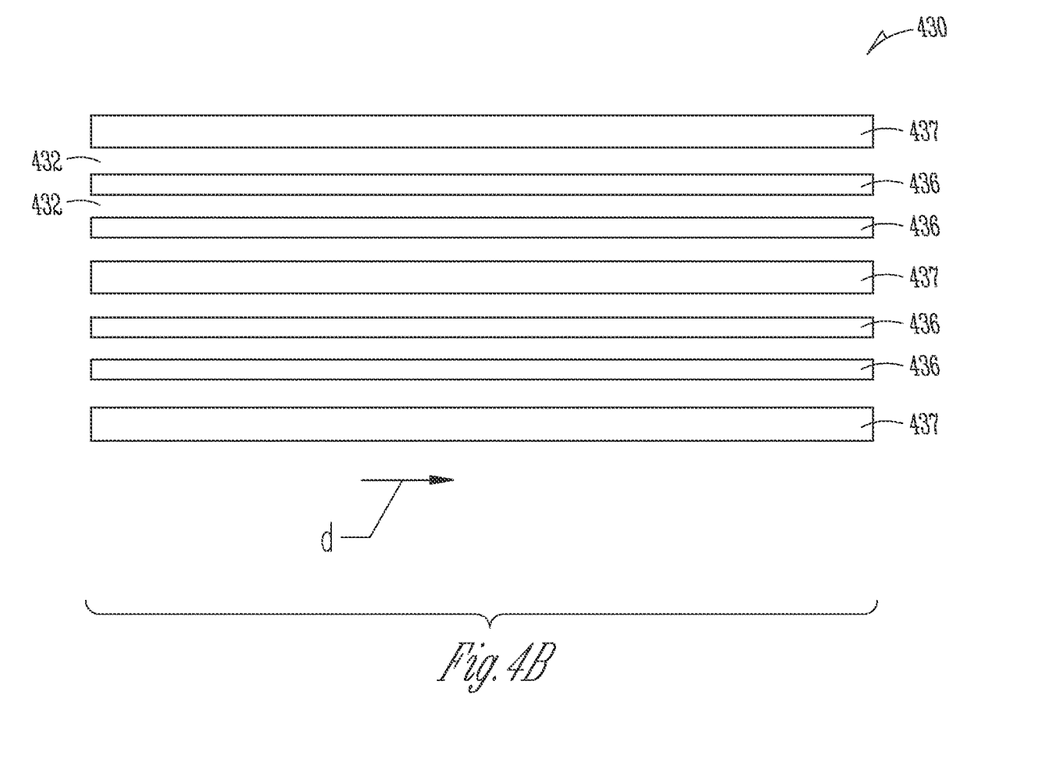
FIG. 4B shows a schematic diagram of a cross-sectional view of a high-speed signal routing carrier in accordance with some example embodiments.

FIGS. 4A and 4B are schematic diagrams of a high-speed signal routing carrier 430. Routing carrier 430 includes substrate 432, differential pairs 436, and ground isolation 437. FIG. 4A shows a cross-sectional view, while FIG. 4B shows a side view along the direction of signal routing.

Differential pairs 436 can be, for example, copper, or other conductive material. Ground isolation 437 can be, for example, a conductive material. Ground isolation 437 can reduce crosstalk between differential pairs within routing carrier 430. Edge to ground spacing ($d_t$) between differential pairs 436 and ground isolation 437 can be tailored depending on the thickness and particular routing of differential pair 436, in addition to the spacing between each differential pair (TS).

The design within routing carrier 430 can be customized depending on the electrical requirements of the high-speed IO. The routing design shown in FIGS. 4A, 4B is one example. Here, routing carrier 430 has two routing layers (differential pairs 436) and three ground layers 437. Ground isolation between the high speed differential pairs 436 can be designed to mitigate the cross-talk risk.

The routing scheme can be customized in a number of ways. For example, the routing scheme can be changed by manipulating the thickness of the differential pair material (e.g., copper or other conductive material). The thickness of the differential pair material can be, for example, from about 12 µm to about 60 µm (e.g., about 15 µm to about 40 µm). Similarly, the differential pair (metallic trace) width, can be tailored. The trace width can be, for example about 20 µm to about 250 µm (e.g., about 60 µm to about 90 µm).

Alternatively, the routing scheme can be altered by changing the thickness of the grounding material (e.g., a dielectric or other non-conductive material). The grounding material can have a thickness of about 20 µm to about 250 µm (e.g., about 60 µm to about 90 µm).

The spacing between the dielectric pairs and/or the ground layers can also be altered. For example, the spacing between the dielectric pair member can be about 60 µm to about 200 µm (e.g., 105 µm). The spacing between a differential pair and the grounding layer can be, for example, about 125 µm to about 175 µm (e.g., 150 µm).

A routing carrier with these parameters can result in less transmission loss. For example, with a 112 or 224 Gbps SerDes configuration using a routing carrier, loss can be as low as about 0.3 to about 1.8 dB (e.g., about 1.2 to about 1.7 dB), or about a 30% to 60% (e.g., about 35% to about 55%) reduction in loss compared to conventional schemes. This can have a significant package loss reduction for HS SerDes signaling speeds. This can alternatively allow for the use of higher loss materials.

Figure 5:
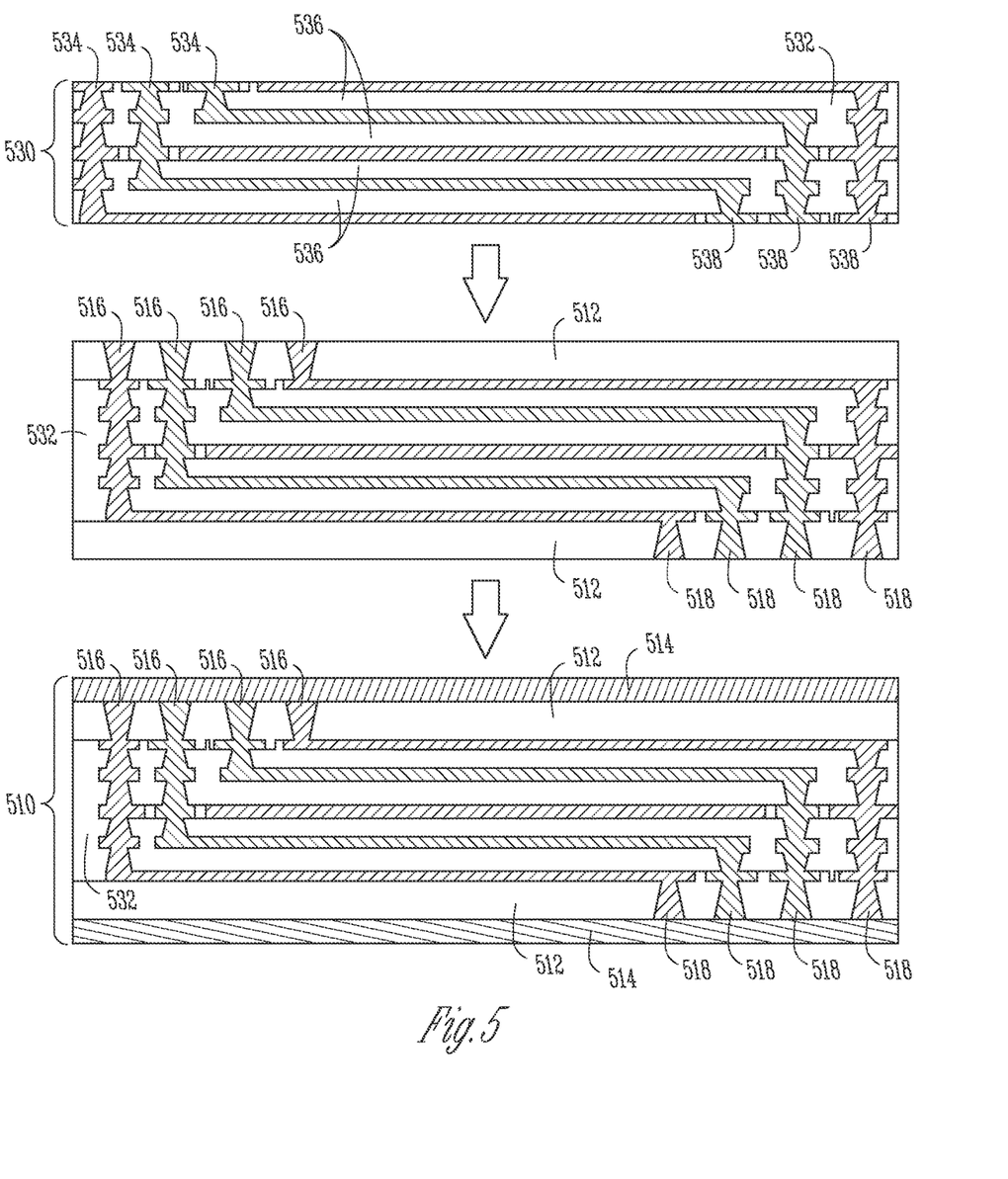
FIG. 5 shows a flow diagram of a method of manufacture of a method of making a high-speed signal routing carrier in accordance with some example embodiments.

FIG. 5 shows a flow diagram of a method of making a high-speed signal routing carrier 530 in accordance with some example embodiments. Shown in FIG. 5 is routing carrier 530 including differential pairs 536a, 536b running from entrance pins 534a, 534b to exit pins 538a, 538b. In the completed routing carrier 530, it is embedded in cored substrate 510, between dielectric (nonconductive) layers 512. The differential pair 536a, 536b, are electrically connected to conductive layers 514 from pins 534 a, 534b, 538a, 538b, through via 516, 518.

In general, a high-speed routing carrier such as carrier 530 can be assembled on the semiconductor package surface, as shown in FIGS. 1A-1B. The substrate 532 of routing carrier 530 can be fabricated first with solder resist openings formed for differential pairs 536a, 536b and pins 534a, 534b, 538a, 538b.

Then, the substrate 532 can be assembled on the regular semiconductor package cored substrate 510. This can be done, for example, using conventional semiconductor package assembly processes, such as soldering flow followed by an underfill process, with dummy bumps added where mechanical enhancement is desired or other suitable processes.

Alternatively, the routing carrier can be assembled internally as shown in FIG. 2. In this case, the routing carrier 530 can be fabricated first with copper pads formed for both signals in the differential pair and the pins.

Next, via 516, 518, can be built into the copper pads on both sides of the routing carrier 530, along with regular cored substrate layers 512, 514, to enforce the mechanical properties for the region adjacent routing carrier 530. The via 516, 518, can be built for electrical connectivity for both IO signals and grounds. Alternatively, the routing carrier 530 can be made of glass enforced substrate material for additional mechanical support in the region.

After via 516, 518, are built, a thick metal layer on both top and bottom of routing carrier 530 can be built. The via 516, 518, can extend to both the surface and bottom layers of the cored substrate 510 through these metal layers.

If through holes are used in the semiconductor package cored substrate 510, the routing carrier 530 has to account for any disruptions in those PTH. In this case, larger via (e.g., plated through holes) can be used to connect the transmission path (differential pair) inside the routing carrier. The larger via can be used to extend to cored substrate surface and/or bottom layers to maintain vertical electrical connections where PTH would conventionally be used.

Figure 6:
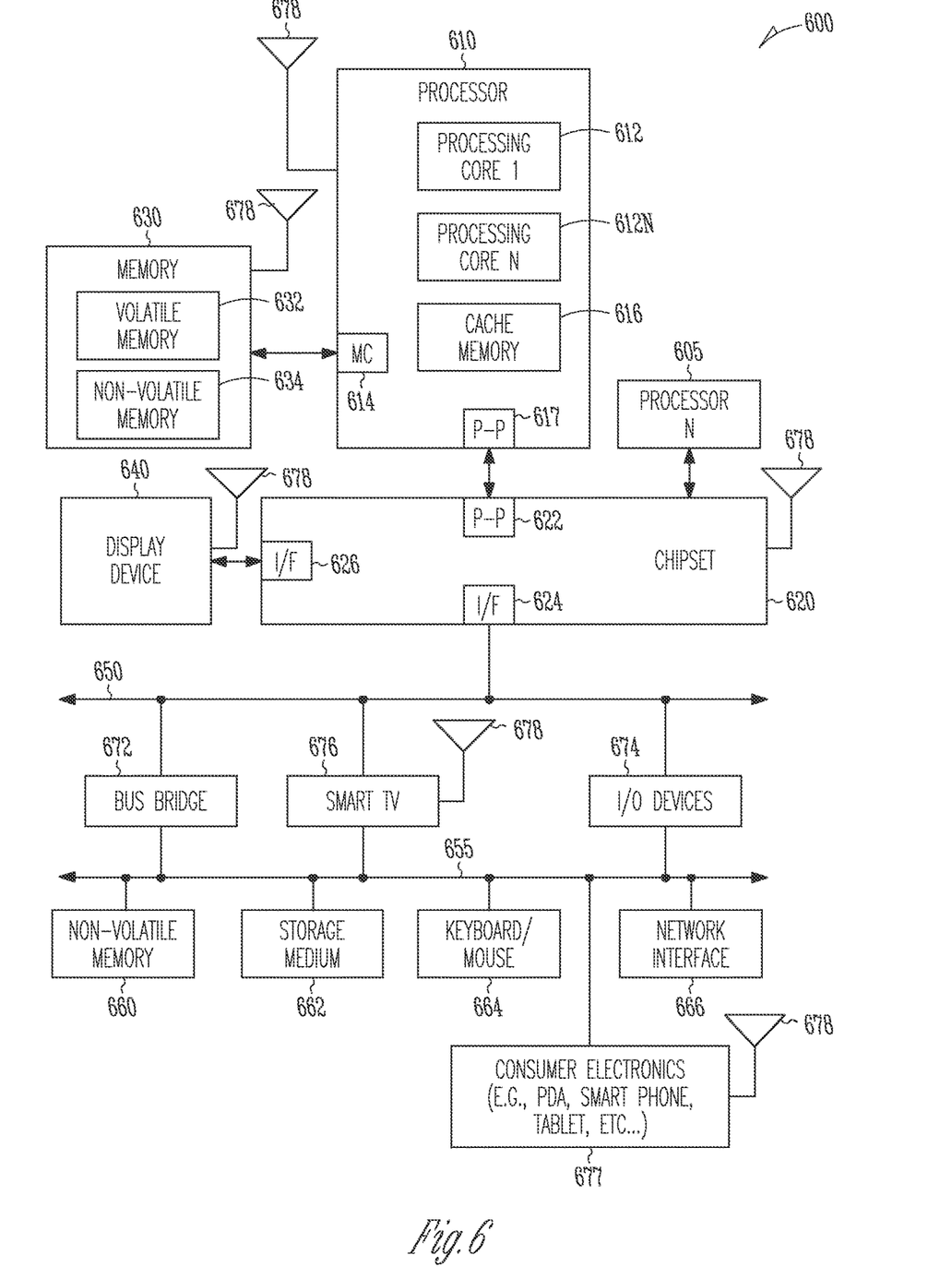
FIG. 6 shows a system that may incorporate a semiconductor package containing a high-speed signal routing carrier, in accordance with some example embodiments.

FIG. 6 illustrates a system level diagram, depicting an example of an electronic device (e.g., system) that may include a semiconductor package including a high-speed signal routing carrier and/or method described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra-Wide Band (UWB), Bluetooth, WiMAX, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® Quick Path Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals. In one example, any combination of components in a chipset may be separated by a continuous flexible shield as described in the present disclosure.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

The routing carrier described with reference to FIGS. 1-5 above can be detected in system 600 through reverse engineering techniques such as x-ray or tear-down of the system.

To better illustrate the method and apparatuses disclosed herein, a non-limiting list of embodiments is provided here:

Example 1 includes article comprising: a substrate; a semiconductor die thereon; a routing carrier attached to the substrate; and a transmission pathway electrically connected to the semiconductor die and the substrate, wherein the transmission pathway runs through the routing carrier.

Example 2 includes Example 1, wherein the routing carrier is attached to a surface of the substrate.

Example 3 includes any of Examples 1-2, wherein the routing carrier is embedded within the substrate.

Example 4 includes any of Examples 1-3, wherein the routing carrier comprises a ceramic, a glass, a glass ceramic, or an organic substrate.

Example 5 includes any of Examples 1-4, wherein the routing carrier is a high-speed signal routing carrier.

Example 6 includes any of Examples 1-5, wherein the routing carrier comprises a serializer deserializer (SerDes).

Example 7 includes any of Examples 1-6, wherein the SerDes comprises a physical layer within the footprint of the SerDes, or one or more satellite dies.

Example 8 includes any of Examples 1-7, wherein the routing carrier comprises a single-ended interface.

Example 9 includes any of Examples 1-8, wherein the substrate comprises a plurality of dielectric layers interspersed with conductive traces.

Example 10 includes any of Examples 1-9, wherein one or more of the conductive traces is electrically connected to the transmission pathway.

Example 11 includes any of Examples 1-10, wherein the conductive traces have a width of about 50 um to about 100 um.

Example 12 includes any of Examples 1-11, wherein the transmission pathway has a length of about 15 mm to about 25 mm.

Example 13 includes any of Examples 1-12, wherein the transmission pathway has a loss of no more than 2.5 dB at a signaling speed of about 100 Gbpa to about 120 Gbps.

Example 14 includes article comprising: a package having a first side and a second side; a semiconductor die on the first side of the package; a differential pair electrically connected to and exiting from the semiconductor die; a routing carrier comprising: an entrance into which the differential pair enters the routing carrier; a channel through which the differential pair runs, the channel comprising a ground isolation layer configured to prevent loss in the differential pair; and an exit where the differential pair exits the routing carrier; and electrical bumps on the second side of the package, wherein the differential pair connects between the exit and the electrical bumps.

Example 15 includes Example 14, wherein the channel comprises one or more ground isolation layers with the differential pair spaced therebetween.

Example 16 includes any of Examples 14-15, wherein the differential pair comprises one or more metallic traces having a thickness of about 50 um to about 100 um.

Example 17 includes method of making an article comprising: manufacturing a substrate; attaching a semiconductor die to the substrate; fabricating a routing carrier comprising a transmission pathway; and integrating the routing carrier into the substrate.

Example 18 includes Example 17, wherein integrating the routing carrier into the substrate comprises manufacturing the substrate around the routing carrier.

Example 19 includes any of Examples 17-18, wherein integrating the routing carrier into the substrate comprises attaching the routing carrier to a surface of the substrate.

Example 20 includes any of Examples 17-19, wherein fabricating the routing carrier comprises: building a transmission pathway into a routing carrier material; running one or more differential pairs through the transmission pathway; and applying one or more grounding layers within the carrier material between the one or more differential pairs.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. An article comprising:
   a substrate;
   a semiconductor die thereon;
   a routing carrier attached to the substrate; and
   a transmission pathway electrically connected to the semiconductor die and the substrate, wherein the transmission pathway runs through the routing carrier,
   wherein the transmission pathway has a loss of no more than 2.5 dB at a signaling speed of about 50 Gbpa to about 250 Gbps.

2. The article of claim 1, wherein the routing carrier is attached to a surface of the substrate.

3. The article of claim 1, wherein the routing carrier is embedded within the substrate.

4. The article of claim 1, wherein the routing carrier is a high-speed signal routing carrier.

5. The article of claim 1, wherein the routing carrier comprises a single-ended interface.

6. The article of claim 1, wherein the substrate comprises a plurality of dielectric layers interspersed with conductive traces.

7. The article of claim 6, wherein one or more of the conductive traces is electrically connected to the transmission pathway.

8. The article of claim 1, wherein the routing carrier comprises a ceramic, a glass, a glass ceramic, or an organic substrate.

9. The article of claim 1, wherein the routing carrier comprises a serializer deserializer (SerDes).

10. The article of claim 1, wherein the routing carrier comprises a single-ended interface.

\* \* \* \* \*